United States Patent
Gomez

(10) Patent No.: US 6,275,106 B1
(45) Date of Patent: Aug. 14, 2001

(54) SPECTRAL DISTORTION MONITOR FOR CONTROLLING PRE-DISTORTION AND FEED-FORWARD LINEARIZATION OF RF POWER AMPLIFIER

(75) Inventor: Jason N. Gomez, Campbell, CA (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/511,877

(22) Filed: Feb. 25, 2000

(51) Int. Cl.[7] .................................. H03F 1/00; H03F 1/26
(52) U.S. Cl. ............................................. 330/151; 330/149
(58) Field of Search ..................................... 330/149, 151

(56) References Cited

U.S. PATENT DOCUMENTS

| | | | |
|---|---|---|---|
| 4,885,551 | 12/1989 | Myer | 330/52 |
| 5,077,532 | 12/1991 | Obermann et al. | 330/151 |
| 5,386,198 | * 1/1995 | Ripstrand et al. | 330/151 |
| 5,491,454 | 2/1996 | Matz | 330/149 |
| 5,760,646 | * 6/1998 | Belcher et al. | 330/149 |
| 5,877,653 | 3/1999 | Kim et al. | 330/149 |
| 6,081,156 | * 6/2000 | Choi et al. | 330/52 |
| 6,118,339 | 9/2000 | Gentzler et al. | 330/149 |

* cited by examiner

Primary Examiner—Robert Pascal
Assistant Examiner—Patricia Nguyen
(74) Attorney, Agent, or Firm—Allen, Dyer, Doppelt, Milbrath & Gilchrist, P.A.

(57) ABSTRACT

A carrier cancellation combiner, and pre-distortion and feed-forward loops of an RF power amplifier are controlled to minimize IMD components at the output of the RF amplifier, by a spectral distortion measurement scheme that performs Fast Fourier Transform (FFT)-based spectral power measurements at a 'reference' signal port (associated with the RF input signal), and a plurality of 'test' signal ports (associated with various monitoring locations of the amplifier). Signals extracted from the control and test ports are downconverted to baseband, bandpass filtered, digitized and stored as a spectral 'snapshot' of the entire band of the signal infrastructure of the amplifier. A digital signal processor-based controller processes the buffered data to produce averaged FFT's of the data extracted from the reference and test ports and thereby provide spectral information for each sampled signal set. The FFT for the control data is processed to establish a baseline, with which the FFTs for the test data are compared, to generate adjustment signals for control parameters through which IMD components introduced by the amplifier may be minimized.

16 Claims, 2 Drawing Sheets

SPECTRAL DISTORTION MONITOR FOR CONTROLLING PRE-DISTORTION AND FEED-FORWARD LINEARIZATION OF RF POWER AMPLIFIER

FIELD OF THE INVENTION

The present invention relates in general to radio frequency (RF) communication systems, and is particularly directed to an RF power amplifier linearization mechanism, that employs a spectral distortion measurement and differential combining scheme, which is operative to optimize the operation of a carrier cancellation combiner, and pre-distortion and feed-forward loops of the RF power amplifier, so that intermodulation distortion produced at the output of the RF amplifier may be minimized.

BACKGROUND OF THE INVENTION

The specifications and regulations of the Federal Communications Commission (FCC) mandate that communication service providers comply with very strict bandwidth constraints, including the requirement that the amount of energy spillover outside a licensed channel or band of interest, be sharply attenuated (e.g., on the order of 50 dB). Although such limitations may be readily overcome for traditional forms of modulation, such as FM, they are difficult to achieve using more contemporary, digitally based modulation formats, such as M-ary modulation.

Attenuating sidebands sufficiently to meet industry or regulatory-based standards using such modulation techniques requires very linear signal processing systems and components. Although relatively linear components can be obtained at a reasonable cost for relatively low bandwidth (baseband) telephone networks, linearizing components such as RF power amplifiers can be prohibitively expensive.

A fundamental difficulty in linearizing an RF power amplifier is the fact that it is an inherently non-linear device, and generates unwanted intermodulation distortion products (IMDs). IMDs manifest themselves as spurious signals in the amplified RF output signal, separate and distinct from the RF input signal. A further manifestation of IMD is spectral regrowth or spreading of a compact spectrum into spectral regions that were not occupied by the RF input signal. This distortion causes the phase-amplitude of the amplified output signal to depart from the phase-amplitude of the input signal, and may be considered as an incidental (and undesired) amplifier-sourced modulation of the RF input signal.

A straightforward way to implement a linear RF power amplifier is to build it as a large, high power device, but operate the amplifier at only a low power level (namely, at a small percentage of its rated output power), where the RF amplifier's transfer function is relatively linear. An obvious drawback to this approach is the overkill penalty—a costly and large sized RF device. Other prior art techniques which overcome this penalty include feedback correction techniques, feedforward correction, and predistortion correction. Feedforward and predistortion correction, however, are not limited in this regard.

Feedback correction techniques include polar envelope correction (such as described in U.S. Pat. No. 5,742,201), and Cartesian feedback, where the distortion component at the output of the RF amplifier is used to directly modulate the input signal to the amplifier in real time. Feedback techniques possess the advantage of self-convergence, as do negative feedback techniques in other fields of design. However, systems which employ negative feedback remain stable over a limited bandwidth, which prevents their application in wide-bandwidth environments, such as multi-carrier or W-CDMA.

In the feedforward approach, error (distortion) present in the RF amplifier's output signal is extracted, amplified to the proper level, and then reinjected with equal amplitude but opposite phase into the output path of the amplifier, so that (ideally) the RF amplifier's distortion is effectively canceled.

With predistortion correction, a signal is modulated onto the RF input signal path upstream of the RF amplifier. The ideal predistortion signal has a characteristic that is the inverse or complement of the distortion expected at the output of the high power RF amplifier, so that when subjected to the distorting transfer function of the RF amplifier, it effectively cancels the distortion behavior.

Either predistortion or feedforward may be made adaptive by extracting an error signal component in the output of the RF amplifier and then adjusting the control signal(s), in accordance with the extracted error behavior of the RF amplifier, so as to effectively continuously minimize distortion in the amplifier's output.

One conventional mechanism for extracting the error signal component is to inject a pilot (tone) signal into the signal flow path through the amplifier and measure the amplifier's response. A fundamental drawback to the use of a pilot tone is the need for dedicated pilot generation circuitry and the difficulty of placing the pilot tone within the signal bandwidth of the amplifier. In addition, pilot tone injection causes the generation of an unwanted spur; also, a piloted system is open-loop in the sense that the controller operates on the pilot and not the IMDs. Hence, the system only assumes that IMDs are being properly cancelled.

Other approaches include the use of a high intercept receiver to detect low level distortion in the presence of high power carriers, which adds substantial complexity and cost, or the use of a wideband correlator. The latter mechanism suffers from the fact that it relies on measurement of wideband energy, rather than on the spectral distortion components.

SUMMARY OF THE INVENTION

In accordance with the present invention, the operation of a carrier cancellation combiner, and predistortion and feed-forward loops of an RF power amplifier are controlled to minimize IMD components at the output of the RF amplifier, by a spectral distortion measurement scheme that performs (Fast Fourier Transform (FFT)-based) spectral power measurements at a 'reference' signal port (associated with the RF input signal), and a plurality of 'test' signal ports (associated with various parameter adjustment locations of the amplifier). Signals extracted from the control and test ports are downconverted to baseband, bandpass filtered, sampled and then stored as a spectral 'snapshot' of the entire band of the signal infrastructure of the amplifier.

Averaged FFT's of the data extracted from the reference port and data from the test ports by a digital signal processor based controller provide spectral information for each sampled signal set. The control data FFT is processed to establish a baseline, with which the test data FFTs are compared to generate adjustment signals for various control parameters, through which IMDs introduced by the amplifier are minimized. The performance of the RF amplifier is continuously monitored and the control parameters modified as necessary to compensate for drift in the amplifier's characteristics.

In accordance with a preferred, but non-limiting embodiment, the invention includes digitally controlled gain and phase adjustment circuits and a digitally controlled predistortion unit incorporated in the RF input signal path to a main RF amplifier. The predistortion unit may contain a work function-based vector modulator that is coupled to receive weighting coefficients from the controller. Since it contains any intermodulation (spectral regrowth) distortion products (IMDs) introduced by the RF amplifier, the output of the amplifier is monitored as one of the test inputs to the controller.

The output of the main RF amplifier is further coupled to a carrier cancellation combiner, a second input of which is coupled to a feed forward path from the RF input signal port. The feed forward path from the RF input signal port includes a fixed delay and a variable delay unit, that serve to substantially equalize the propagation delay of the signal path through the main RF amplifier, and thereby provide proper phase alignment of the signals applied to the carrier cancellation combiner. The output of the carrier cancellation combiner is coupled to gain and phase adjustment circuits of a feed forward error amplifier, the output of which is reinjected into the output path of the RF amplifier, for feed-forward IMD cancellation.

The DSP-based controller performs various spectral distortion measurement operations, and error minimization algorithms such as, but not limited to power or least mean squared minimization, to control variable gain and phase shift components in both the main RF amplifier and error amplifier signal paths, for the purpose of optimally canceling IMD components at the RF output port. It also generates work function-based predistortion control signals derived from respectively different work functions of the instantaneous amplitude of the RF input signal, so as to predistort phase and amplitude components of the RF input signal to the main RF amplifier.

The DSP controller is operative to process the spectral data samples derived from the control and test ports, and then adjusts the parameters of the control components as necessary to compensate for main RF amplifier distortion. In order to maximize carrier cancellation, the controller (FFT)-processes the control data to identify any carriers present in the RF input signal, and the noise floor. FFT-processing the data allows spectral energy in one or more frequency bins, other than the portion of the spectrum in which the carrier components are located, to be selectively discarded, to avoid erroneously influencing the carrier cancellation loop.

Optimal (maximum) cancellation of carrier components is accomplished by adjusting the gain and phase adjustment circuits in the RF input signal path and the adjustable delay unit, so as to maximize the expression:

$$\frac{1}{N}\sum_{i=1}^{i=N}(Ci-Ri)$$

where N is the total number of carriers,

Ci is the average power of carrier Ci of N, and

Ri is the average power of residual carrier Ri of N.

Maximizing this expression has the effect of reducing the average energy in the identified residual carrier components at the output of carrier cancellation combiner to as close to zero as possible (optimal carrier cancellation), without subjecting the maximization operation to the influence of frequency spurs in bins other those containing the carrier(s).

To optimally control the pre-distortion components at the input to the main RF amplifier, the FFT of the control data is subtracted from the FFT of the monitored output of the main RF amplifier to obtain the IMD components; then the gain and phase adjustment circuits of the predistortion unit are adjusted to minimize the following expression:

$$\frac{1}{N}\sum_{i=1}^{i=N}Di \qquad (2)$$

where Di is the distortion component i of N detected spectral components resulting from the subtraction operation.

For optimal feed-forward compensation the FFT of the control data is subtracted from the FFT of the of RF output signal monitored downstream of the feed forward reinjection port. The gain and phase adjustment circuits for the feed forward error amplifier are then adjusted to minimize the following expression:

$$\frac{1}{N}\sum_{i=1}^{i=N}Di \qquad (3)$$

where Di is the distortion component i of N detected spectral components resulting from the subtraction operation.

DETAILED DESCRIPTION

Figure 1:
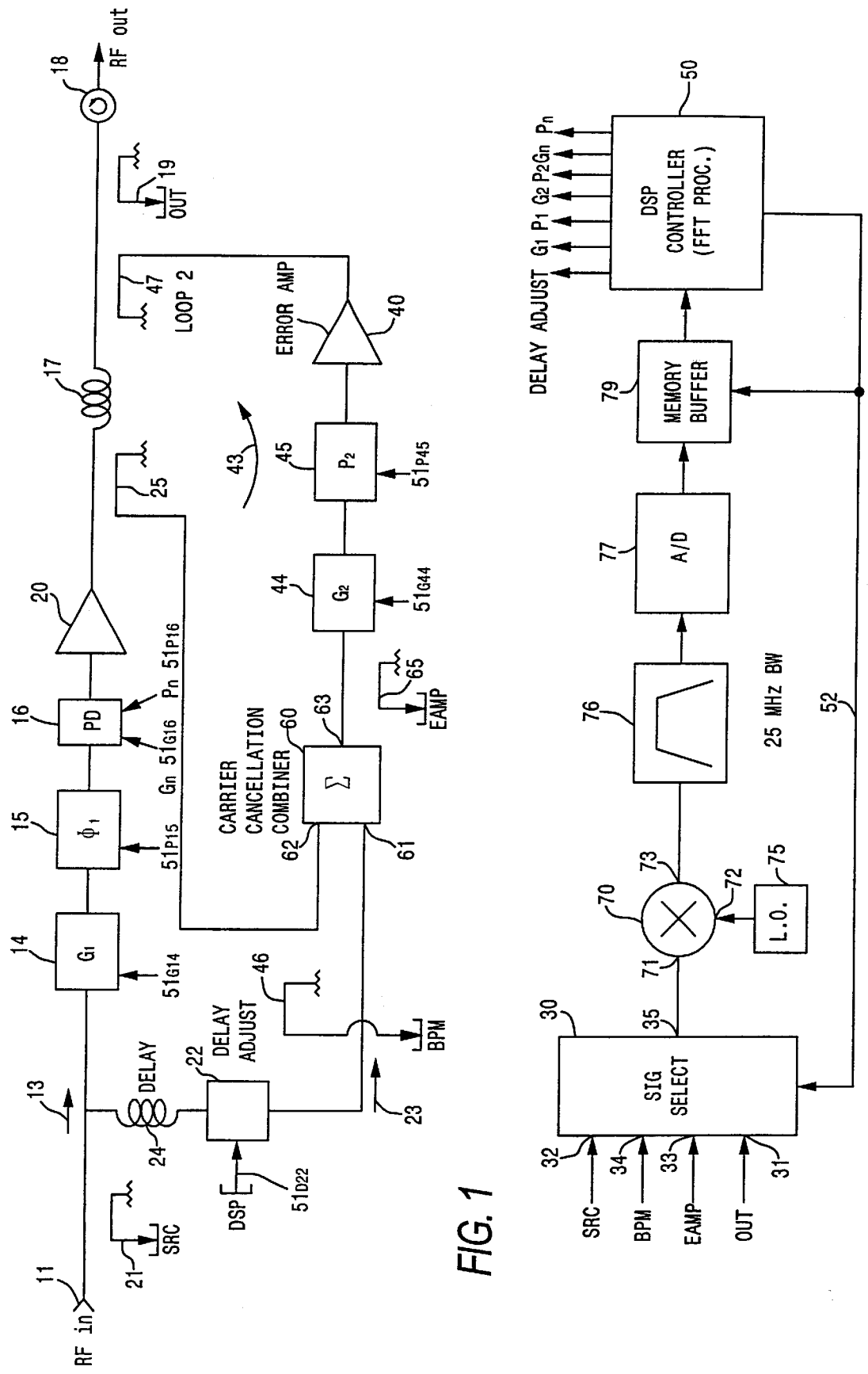
FIG. 1 diagrammatically illustrates an RF power amplifier spectral measurement and distortion correction scheme in accordance with an embodiment of the invention.

Before describing in detail the new and improved RF power amplifier spectral measurement and distortion correction mechanism in accordance with the present invention, it should be observed that the invention resides primarily in a prescribed arrangement of conventional RF circuits, associated digital signal processing components and attendant supervisory control circuitry, that controls the operation of such circuits and components. As a result, the configuration of such circuit components, and the manner in which they interface with other communication system equipment have, for the most part, been illustrated in the drawings by a readily understandable block diagram, which shows only those details that are pertinent to the present invention, so as not to obscure the disclosure with details which will be readily apparent to those skilled in the art having the benefit of the description herein. Thus, the block diagram illustration is primarily intended to show the components in a convenient functional grouping, whereby the invention may be more readily understood.

Referring now to FIG. 1, a non-limiting embodiment of an RF power amplifier spectral measurement and distortion correction scheme in accordance with the present invention is diagrammatically illustrated as comprising an RF input port 11, to which an RF signal $RF_{in}$ to be amplified is coupled. RF input port 11 is coupled over an input signal path 13 to a main RF power amplifier (or basic power module (BPM) 20, whose non-linear spectral distortion (IMD) introducing behavior is to be compensated. The input signal path 13 to RF amplifier 20 includes digitally controlled gain and phase adjustment circuits 14 and 15, respectively, and a digitally controlled predistortion unit 16.

As a preferred, but not limiting example, the digitally controlled predistortion unit 16 may contain a work function-based vector modulator, that is coupled to receive a set of weighting coefficients $w_0, w_1, w_2, \ldots, w_N$, supplied by a performance monitoring and parameter-updating digital signal processor (DSP)-based controller 50. The DSP controller 50 executes spectral distortion measurement and error minimization algorithms (to be described) for adjusting the pre-distortion properties of predistortion unit 16, and also controls the digitally controlled gain and phase adjustment circuits 14 and 15 of the input signal path, digitally controlled gain and phase adjustment circuits 44 and 45 of a feed forward loop 43 to an error amplifier 40, and an adjustable delay unit 22 that is coupled in a feed forward path 23 to a carrier cancellation combiner 60, as will be described. (The control lines 51 from controller 50 are denoted by subscripts associated with the respective components being controlled.)

The output of the RF power amplifier 20 is coupled through a downstream delay unit 17 and circulator 18 to an RF output port $RF_{out}$. An RF output directional coupler 19 is coupled to the output path of the amplifier by means of a feed forward reinjection directional coupler 47. RF output directional coupler 19 serves as a test signal port that is employed to extract a signal 'OUT', representative of the composite amplified RF signal, including intermodulation (spectral regrowth) distortion products (IMDs) introduced by the RF amplifier, and reductions therein due to the feed forward injection.

This extracted RF output signal (OUT) is coupled from the directional coupler 19 to a first input 31 of a DSP-controlled switch 30. In order to enable the DSP controller 50 to monitor the RF input signal $RF_{in}$ as a reference or control signal 'SRC', the RF input port 11 is coupled through a directional coupler 21 to a second input 32 of controlled switch 30.

The output 35 of the switch 30 is coupled to a first input 71 of a mixer 70, a second input 72 of which is coupled to receive an IF frequency provided by a local oscillator 75. The mixer 70 is operative to down-convert the output of the switch 30 to baseband. This baseband signal is then filtered in a bandpass filter 76, digitized by a high speed analog-to-digital converter (ADC) 77, and then stored in a buffer memory 79 for analysis by the DSP controller 50, as will be described. The steering operation of switch 30 and read/write control of memory 79 are controlled by a control link 52 from the DSP 50 controller.

The feed forward path 23 to the carrier cancellation combiner 60 (which may be configured as a Wilkinson combiner) includes a fixed delay line 24 coupled in series with the variable delay unit 22 from the RF input path 13 to a first input 61 of the carrier cancellation combiner 60. The second input port 62 of the carrier cancellation combiner 60 is coupled via a directional coupler 25 to the output of the RF amplifier 20. The delay is employed to substantially equalize the propagation delay of the feed forward path with the RF signal path through the RF amplifier to a second input port 62 of the RF carrier cancellation combiner 60 and ensure phase alignment of the signals applied to the combiner.

By subtracting the split RF output signal extracted by the directional coupler 25 at the output of the RF amplifier 20 from the split RF reference or input signal $RF_{in}$ Of the feed-forward path 23, the carrier cancellation combiner 60 cancels RF carrier components at its output, so as to produce a signal 'Eamp' representative of the IMD portion of the output of the RF amplifier 20. The signal Eamp is coupled to respective digitally controlled gain and phase adjustment circuits 44 and 45 to the error amplifier 40, whose output is reinjected into the output path of RF amplifier 20 by the directional coupler 47 installed upstream of directional coupler 19, as described above.

The signal Eamp is extracted via a further test port directional coupler 65, installed with the feed forward loop 43 at the output of the carrier cancellation combiner 60, and coupled to a third input 33 of the controlled switch 30. An additional directional test port coupler 46 is coupled to the path from the directional coupler 25 at the output of the main RF amplifier 20, so as to provide a further signal 'BPM' representative of the amplified output of amplifier 20 to fourth input 34 of controlled switch 30.

As described briefly above, the DSP-based controller 50 uses various spectral distortion measurement operations, and error minimization algorithms (e.g., power or least mean squared minimization) for controlling variable gain and phase shift components in both the main RF amplifier and error amplifier signal paths, for the purpose of optimally canceling IMD components at the RF output port $RF_{out}$. It also generates work function-based predistortion control signals derived from respectively different work functions of the instantaneous amplitude of the RF input signal to predistort phase and amplitude components of the RF input signal to the main RF amplifier.

Pursuant to the present invention, and as will be described below with reference to FIGS. 2–5, the DSP controller 50 executes what are effectively (Fast Fourier Transform (FFT)-based) spectral power measurements in portions or bins of the frequency spectrum of each of the monitored reference port signal 'SRC', and test port signals 'OUT', 'Eamp', and 'BPM', downconverted to baseband, bandpass filtered, sampled and then stored as a picture or 'snapshot' of the spectral composition of the entire band. Averaged FFT's of reference data samples (associated with the SRC port) and respective sets of test data samples (associated with the OUT, Eamp and BPM ports) are performed to obtain the spectral information for each sampled signal set of a respective spectral snapshot. The control (SRC) data is processed to establish a baseline, with which the test data is compared to produce adjustment signals for the various control parameters, and thereby minimize IMDs introduced by the main RF amplifier. With the control parameters initially corrected, the performance of the main RF amplifier is thereafter continuously monitored and the adjustable parameters as necessary to compensate for any drift in the amplifier's characteristics.

Carrier-Cancellation (Test data: Eamp.)

Figure 2:
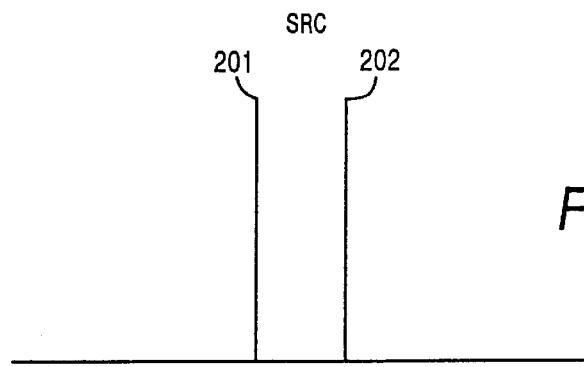
FIGS. 2–5 are respective spectral diagrams associated with the operation of the RF power amplifier arrangement of FIG. 1.

In order to maximize carrier cancellation by the RF carrier cancellation combiner 60, the DSP controller (FFT)-processes the SRC data to identify any carriers present in the RF input signal, such as those shown at 201 and 202 in the spectral diagram FIG. 2, and the noise floor. By limiting the data to only that portion of the spectrum in which carrier components have been identified, other spectral energy outside the carrier frequency region of interest may be discarded, so as to not (erroneously) influence the carrier cancellation operation.

Figure 3:
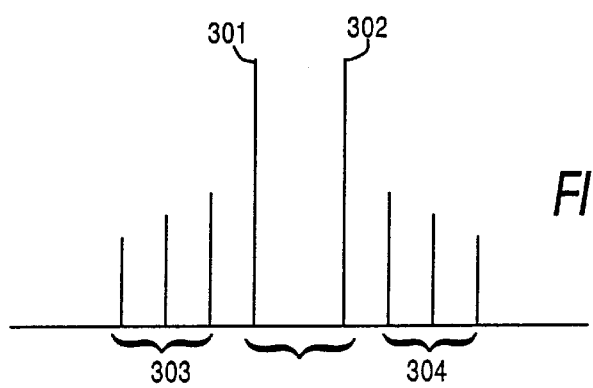
Figure 4:
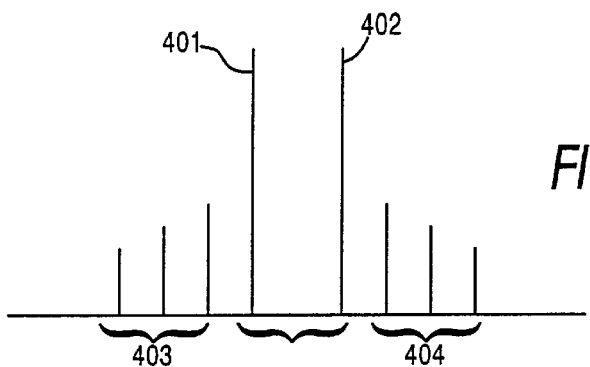
Figure 5:
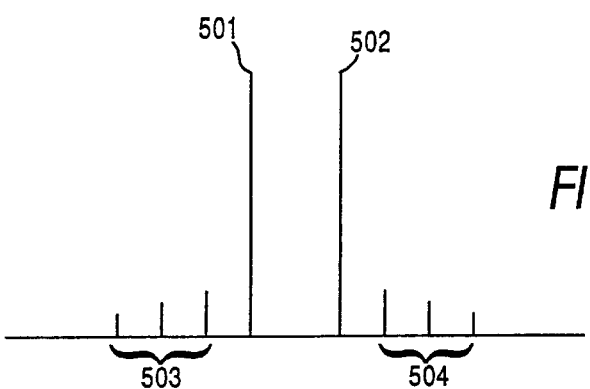

FFT processing of the carrier cancellation test data (Eamp) will typically produce a spectral distribution as shown in the spectral diagram of FIG. 3, which includes (reduced amplitude) residual carrier components 301 and 302 (respectively associated with the carriers 201 and 202 of FIG. 2), as well as spurious (IMD) components shown in spectral regions or bins 303 and 304 outside the spectral region containing the carriers, the energy content of which should not contribute to carrier cancellation. Optimal (maximum) cancellation of carrier components is accomplished by adjusting the gain and phase adjustment circuits 14 and 15 and adjustable delay unit 22, so as to maximize the expression (1):

$$\frac{1}{N}\sum_{i=1}^{i=N}(Ci-Ri) \quad (1)$$

where N is the total number of carriers,

Ci is the average power of carrier Ci of N, and

Ri is the average power of residual carrier Ri of N.

As can be seen from a comparison of the spectral diagrams of FIGS. 2 and 3, maximizing the expression (1) has the effect of reducing the average energy in the identified residual carrier components at the output of carrier cancellation combiner 60 to as close to zero as possible (optimal carrier cancellation), without influencing the maximization operation to energy in spurious components in frequency bins other those containing the carriers. As this provides a direct measure of carrier cancellation (with both IMDs and carriers being measured simultaneously), the system effectively 'knows' whether or not it is functioning properly—which is not achievable with conventional correlator-based or power-detector energy minimization approaches.

Moreover, such conventional power detector energy minimization and correlator based schemes are subject to input drive power and cannot resolve whether power is present or not. The present invention obviates the need for additional circuitry to 'interrupt' the control loop under this condition, and eliminates zero-input drift. In addition, the use of the adjustable delay element 22 allows the invention to detect and optimally tune the delay for any signal misalignment, thereby maximizing carrier cancellation.

As an alternate method, carrier cancellation may be carried out in accordance with the minimization routine:

$$\frac{1}{N}\sum_{i=1}^{i=N} Ri$$

where N is the total number of carriers, and

Ri equals the residual carrier bins identified in the reference port. All other bins are discarded.

Pre-Distortion (Test Data: BPM)

As in the case of carrier cancellation, described above, the DSP controller 50 (FFT)-processes the SRC data to identify any carriers present in the RF input signal, as shown in the spectral diagram FIG. 2, and the noise floor. FFT processing of the pre-distortion test data (BPM) will typically produce a spectral distribution as shown in the spectral diagram of FIG. 4, having amplified carrier components 401 and 402 (respectively associated with the carriers 201 and 202 of FIG. 2), as well as IMD components shown in regions 403 and 404, that lie outside the spectral region of the carriers.

Optimal pre-distortion is accomplished by first subtracting the $FFT_{SRC}$ of the control data (SRC) from the $FFT_{BPM}$ of the test data (BPM), to obtain the IMD components (in regions 403 and 404 of FIG. 4), and then adjusting the gain and phase adjustment circuits 14 and 15 and predistortion unit 16, so as to minimize the following expression (2):

$$\frac{1}{N}\sum_{i=1}^{i=N} Di \quad (2)$$

where Di is the distortion component i of N detected spectral components resulting from $FFT_{BPM}-FFT_{SRC}$.

As an alternate pre-distortion method, EAMP may be employed as the test port in place of the BPM port, since each contains the same IMD information.

Because the present invention enables IMD's to be minimized in the presence of carrier, it avoids the problems of carrier energy removal-based approaches, which require some amount of carrier energy removal in order to detect changes in the pre-distortion circuitry, and therefore suffer performance monitoring degradation as more carrier energy is leaked.

Feed-Forward Correction (Test Data: OUT)

As in the carrier cancellation and predistortion operations described above, the DSP controller 50 (FFT)-processes the SRC data to identify any carriers present in the RF input signal (FIG. 2) and the noise floor. FFT processing of the feed-forward data (OUT) will typically produce a spectral distribution as shown in the spectral diagram of FIG. 5, including amplified carrier components 501 and 502 (respectively associated with the carriers 201 and 202 of FIG. 2), as well as (reduced amplitude) IMD components shown in regions 503 and 504, that lie outside the spectral region of the carriers.

Optimal feed-forward compensation is accomplished by first subtracting the $FFT_{SRC}$ of the control data (SRC) from the $FFT_{OUT}$ of the test data (OUT), to obtain the IMD components (in regions 503 and 504 of FIG. 5), and then adjusting the gain and phase adjustment circuits 44 and 45, so as to minimize the following expression (3):

$$\frac{1}{N}\sum_{i=1}^{i=N} Di \quad (3)$$

where Di is the distortion component i of N detected spectral components resulting from $FFT_{OUT}-FFT_{SRC}$.

The spectral reduction mechanism of the invention is particularly advantageous with respect to pilot tone based systems that measure amplitude and phase differences of output-delay line and feed-forward path. The invention inherently accounts for changes in the amplifier that cause 'targets' of the control loop to drift (and mandate periodic re-calibration of pilot tone systems), and is therefore effectively self-calibrating. In addition, the invention is wide bandwidth, whereas pilot tone approaches operate only a portion of the band, or operate out-of-band and simply assume that proper cancellation will be performed in the actual band of interest.

Also, pilot tone based receiver and pilot tone based energy reduction schemes are unable to directly measure IMD performance or detect spurs, and therefore may leave a spur that is 'out-of-spec' to prevent the amplifier's true performance from being seen. The present invention, on the other hand, is able to minimize IMD's to within a given specification and can directly measure IMD performance.

In a modification of the architecture of FIG. 1, for both pre-distortion and feed-forward correction, the FFT subtraction operations may be replaced by applying the test data to the signal carrier used by the control port. The summation operation of each of equations (2) and (3) would then ignore signals already identified at the control port.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. An RF power amplifier arrangement comprising:
    an RF input port to which an RF input signal is applied;
    an RF output port from which an amplified RF output signal is derived;
    an RF signal processing path coupled between said RF input and output ports, and including an RF power amplifier and an RF distortion correction unit that is controllably operative to adjust one or more parameters of said RF signal processing path so as to compensate for distortion introduced by said RF power amplifier;
    a carrier cancellation combiner having inputs coupled to said RF input port and to an output of said RF amplifier, and having an output coupled over a feed forward path through an error amplifier of a reinjection path to said RF output port;
    a reference signal port coupled to said RF input port;
    a first test signal port coupled to said RF output port;
    a second test signal port coupled to said output of said RF amplifier;
    a third test signal port coupled to said output of said carrier cancellation combiner; and
    a signal processor coupled to derive a set of data representative of the signal composition of the entire band of the signal infrastructure of said amplifier as provided by all of said signals monitored at said reference signal port and said first, second and third test signal ports, and to process said set of data to derive control signals that control modification of said RF input signal by said RF signal processing path and modification of said output of said carrier cancellation by said feed forward path through said error amplifier, in a manner that minimizes distortion introduced by said RF amplifier into said amplified RF output signal.

2. An RF power amplifier arrangement according to claim 1, wherein said signal processor is operative to analyze frequency content of said set of data to derive control signals that control modification of said RF input signal by said RF signal processing path and modification of said output of said carrier cancellation by said feed forward path through said error amplifier, in accordance with prescribed relationships among selected portions of the analyzed frequency content of said set of data.

3. An RF power amplifier arrangement according to claim 2, wherein said signal processor is operative to control modification of said RF input signal by said predistortion unit of said RF signal processing path in accordance with differences between selected spectral components of the frequency content of that portion of said set of data associated with said reference signal port and said second test signal port.

4. An RF power amplifier arrangement according to claim 2, wherein said signal processor is operative to control modification of said RF input signal by said RF signal processing path, in accordance with differences between selected spectral components of said set of data associated with the frequency content of said reference signal port and said third test signal port.

5. An RF power amplifier arrangement according to claim 4, further including an adjustable delay coupled between said RF input port and an input to said carrier cancellation combiner, and wherein said signal processor is operative to adjust said delay in accordance with said differences between selected spectral components of said set of data associated with the frequency content of said reference signal port and said third test signal port, so as to maximize carrier cancellation by said carrier cancellation combiner.

6. An RF power amplifier arrangement according to claim 2, wherein said signal processor is operative to control modification of said RF input signal by said feed forward path through said error amplifier, in accordance with differences between selected spectral components of said set of data associated with the frequency content of said reference signal port and said first test signal port.

7. An RF power amplifier arrangement according to claim 1, wherein said signal processor is operative to derive said set of data in accordance with averaged Fourier transforms of each of said signals monitored at said reference signal port and said first, second and third test signal ports, and to control modification of said RF input signal by said RF signal processing path and modification of said output of said carrier cancellation by said feed forward path through said error amplifier, in accordance with prescribed relationships among said averaged Fourier transforms.

8. A method of measuring and compensating for distortion in an RF power amplifier coupled in an RF signal processing path between an RF input port to which an RF input signal is coupled and an RF output port from which an amplified RF output signal is derived, said method comprising the steps of:
    (a) providing a distortion correction unit that is controllably operative to adjust one or more parameters of said RF signal processing path to compensate for distortion introduced by said RF power amplifier;
    (b) coupling said RF input port and an output of said RF amplifier to a carrier cancellation combiner having an output coupled over a feed forward path through an error amplifier of a reinjection path to said RF output port;
    (c) coupling a reference signal port coupled to said RF input port;
    (d) coupling a first test signal port coupled to said RF output port;
    (e) coupling a second test signal port coupled to said output of said RF amplifier;
    (f) coupling a third test signal port coupled to said output of said carrier cancellation combiner;
    (g) monitoring signals at said reference signal port and said first, second and third test signal ports;
    (h) deriving a set of data representative of the signal composition of the entire band of the signal infrastructure of said amplifier as provided by all of said signals monitored in step (g), and processing said data to produce control signals for controlling modification of said RF input signal by said RF signal processing path and modification of said output of said carrier cancellation by said feed forward path through said error amplifier, that minimizes distortion introduced by said RF amplifier into said amplified RF output signal; and
    (i) controlling modification of said RF input signal by said RF signal processing path and modification of said output of said carrier cancellation by said feed forward path through said error amplifier, in accordance with said control signals produced in step (h) so as to minimize distortion introduced by said RF amplifier into said amplified RF output signal.

9. A method according to claim 8, wherein step (h) comprises analyzing frequency content of said set of data, and generating said control signals in accordance with prescribed relationships among selected portions of the analyzed frequency content of said set of data associated with each of said signals monitored at said reference signal port and at said first, second and third test signal ports.

10. A method according to claim 9, wherein step (h) comprises generating control signals for modifying said RF input signal by said predistortion unit of said RF signal processing path in accordance with differences between selected spectral components of that portion of said set of data associated with the frequency content of said reference signal port and said second test signal port.

11. A method according to claim 9, wherein step (h) comprises generating control signals for modifying said RF input signal by said RF signal processing path, in accordance with differences between selected spectral components of the frequency content of that portion of said set of data associated with said reference signal port and said third test signal port.

12. A method according to claim 11, further including an adjustable delay coupled between said RF input port and an input to said carrier cancellation combiner, and wherein step (h) comprises generating control signals for adjusting said delay in accordance with said differences between selected spectral components of that portion of said set of data associated with the frequency content of said reference signal port and said third test signal port, so as to maximize carrier cancellation by said carrier cancellation combiner.

13. A method according to claim 9, wherein step (h) comprises generating control signals for modifying said RF input signal by said feed forward path through said error amplifier, in accordance with differences between selected spectral components of that portion of said set of data associated with the frequency content of said reference signal port and said first test signal port.

14. A method according to claim 8, wherein step (h) comprises deriving said set of data in accordance with averaged Fourier transforms of each of said signals monitored at said reference signal port and said first, second and third test signal ports, and generating control signals for controlling modification of said RF input signal by said RF signal processing path and modification of said output of said carrier cancellation by said feed forward path through said error amplifier, in accordance with prescribed relationships among said averaged Fourier transforms.

15. An RF power amplifier arrangement comprising:
an RF input port to which an RF input signal is applied;
an RF output port from which an amplified RF output signal is derived;
an RF signal processing path coupled between said RF input and output ports, and including an RF power amplifier and an RF distortion correction unit that is controllably operative to adjust one or more parameters of said RF signal processing path so as to compensate for distortion introduced by said RF power amplifier;
a carrier cancellation combiner having inputs coupled to said RF input port and to an output of said RF amplifier, and having an output coupled over a feed forward path through an error amplifier of a reinjection path to said RF output port;
a reference signal port coupled to said RF input port;
a first test signal port coupled to said RF output port;
a second test signal port coupled to said output of said RF amplifier;
a third test signal port coupled to said output of said carrier cancellation combiner; and
a signal processor coupled to process signals monitored at said reference signal port and said first, second and third test signal ports in accordance with prescribed spectral content relationships thereamong, and to control modification of said RF input signal by said RF signal processing path and modification of said output of said carrier cancellation by said feed forward path through said error amplifier, in a manner that minimizes distortion introduced by said RF amplifier into said amplified RF output signal; and wherein
said signal processor is operative to generate averaged Fourier transforms of each of said signals monitored at said reference signal port and said first, second and third test signal ports, and to control modification of said RF input signal by said RF signal processing path and modification of said output of said carrier cancellation by said feed forward path through said error amplifier, in accordance with prescribed relationships among said averaged Fourier transforms.

16. A method of measuring and compensating for distortion in an RF power amplifier coupled in an RF signal processing path between an RF input port to which an RF input signal is coupled and an RF output port from which an amplified RF output signal is derived, said method comprising the steps of:
(a) providing a distortion correction unit that is controllably operative to adjust one or more parameters of said RF signal processing path to compensate for distortion introduced by said RF power amplifier;
(b) coupling said RF input port and an output of said RF amplifier to a carrier cancellation combiner having an output coupled over a feed forward path through an error amplifier of a reinjection path to said RF output port;
(c) coupling a reference signal port coupled to said RF input port;
(d) coupling a first test signal port coupled to said RF output port;
(e) coupling a second test signal port coupled to said output of said RF amplifier;
(f) coupling a third test signal port coupled to said output of said carrier cancellation combiner;
(g) monitoring signals at said reference signal port and said first, second and third test signal ports;
(h) processing signals monitored in step (g) in accordance with prescribed spectral content relationships thereamong, to produce control signals for controlling modification of said RF input signal by said RF signal processing path and modification of said output of said carrier cancellation by said feed forward path through said error amplifier; and
(i) controlling modification of said RF input signal by said RF signal processing path and modification of said output of said carrier cancellation by said feed forward path through said error amplifier, in accordance with said control signals produced in step (h) so as to minimize distortion introduced by said RF amplifier into said amplified RF output signal; and wherein
step (h) comprises generating averaged Fourier transforms of each of said signals monitored at said reference signal port and said first, second and third test signal ports, and generating control signals for controlling modification of said RF input signal by said RF signal processing path and modification of said output of said carrier cancellation by said feed forward path through said error amplifier, in accordance with prescribed relationships among said averaged Fourier transforms.

* * * * *